United States Patent
Desai et al.

(10) Patent No.: US 9,633,742 B2
(45) Date of Patent: Apr. 25, 2017

(54) SEGMENTATION OF BLOCKS FOR FASTER BIT LINE SETTLING/RECOVERY IN NON-VOLATILE MEMORY DEVICES

(71) Applicant: SanDisk Technologies LLC, Plano, TX (US)

(72) Inventors: Amul Dhirajbhai Desai, Fremont, CA (US); Hao Nguyen, San Jose, CA (US); Seungpil Lee, San Ramon, CA (US); Man Mui, Fremont, CA (US)

(73) Assignee: SanDisk Technologies LLC, Plano, TX (US)

(*) Notice: Subject to any disclaimer, the term of this patent is extended or adjusted under 35 U.S.C. 154(b) by 0 days.

(21) Appl. No.: 14/328,018

(22) Filed: Jul. 10, 2014

(65) Prior Publication Data
US 2016/0012903 A1    Jan. 14, 2016

(51) Int. Cl.

| | | |
|---|---|---|
| *G11C 16/32* | (2006.01) | |
| *G11C 16/26* | (2006.01) | |
| *G11C 16/34* | (2006.01) | |
| *G11C 7/08* | (2006.01) | |
| *G11C 11/56* | (2006.01) | |
| *G11C 16/04* | (2006.01) | |
| *H01L 27/115* | (2017.01) | |
| *H01L 27/1157* | (2017.01) | |
| *H01L 27/11582* | (2017.01) | |
| *G11C 16/16* | (2006.01) | |

(52) U.S. Cl.
CPC ............. *G11C 16/32* (2013.01); *G11C 7/08* (2013.01); *G11C 11/5642* (2013.01); *G11C 16/0483* (2013.01); *G11C 16/26* (2013.01); *G11C 16/3459* (2013.01); *H01L 27/115* (2013.01); *H01L 27/1157* (2013.01); *H01L 27/11582* (2013.01); *G11C 16/16* (2013.01)

(58) Field of Classification Search
CPC ................................ G11C 16/04; G11C 16/06
USPC .................. 365/185, 17, 185.21, 185.27
See application file for complete search history.

(56) References Cited

U.S. PATENT DOCUMENTS 5,070,032 A    12/1991 Yuan et al.
5,095,344 A    3/1992 Harari
(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Son Mai
*Assistant Examiner* — Muna A Techane
(74) *Attorney, Agent, or Firm* — Stoel Rives LLP

(57) ABSTRACT

In non-volatile memory circuits, the amount of time needed for bit lines to settle can vary significantly depending on the location of the blocks selected. For example, in a sensing operation, the amount of time for bit lines to settle when being pre-charged by sense amplifiers will be shorter for blocks near the sense amps than for far side blocks. These variations can be particularly acute in high density memory structures, such as in 3D NAND memory, such as that of the BiCS variety. Rather than use the same timing for all blocks, the blocks can be segmented into groups based on their proximity to the sense amps. When performing a sensing operation, the timing can be adjusted based on the block group to which a selected page of memory cells belongs.

18 Claims, 13 Drawing Sheets

(56) References Cited

U.S. PATENT DOCUMENTS

| | | | |
|---|---|---|---|
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,595,924 A | 1/1997 | Yuan et al. |
| 5,661,053 A | 8/1997 | Yuan |
| 5,768,192 A | 6/1998 | Eitan |
| 5,798,966 A | 8/1998 | Keeney |
| 5,903,495 A | 5/1999 | Takeuchi et al. |
| 6,011,725 A | 1/2000 | Eitan |
| 6,046,935 A | 4/2000 | Takeuchi et al. |
| 6,222,762 B1 | 4/2001 | Guterman et al. |
| 6,870,766 B2 | 3/2005 | Cho et al. |
| 7,289,365 B2 | 10/2007 | Shuto |
| 7,411,830 B2 | 8/2008 | Takeuchi et al. |
| 7,460,407 B2 | 12/2008 | Mokhlesi et al. |
| 7,518,920 B2 | 4/2009 | Kang |
| 7,518,921 B2 | 4/2009 | Maejima et al. |
| 7,551,477 B2 | 6/2009 | Mokhlesi et al. |
| 7,630,244 B2 | 12/2009 | Lee |
| 7,911,864 B2 | 3/2011 | Itoh |
| 7,974,134 B2 | 7/2011 | Zhang et al. |
| 7,986,579 B2 | 7/2011 | Akaogi |
| 8,208,333 B2 | 6/2012 | Itoh |
| 8,228,739 B2 | 7/2012 | Pan et al. |
| 8,874,825 B2 | 10/2014 | Alrod et al. |
| 8,902,661 B1 | 12/2014 | Raghu et al. |
| 2003/0189856 A1 | 10/2003 | Cho et al. |
| 2005/0036369 A1 | 2/2005 | Lee et al. |
| 2005/0237829 A1 | 10/2005 | Nakamura |
| 2005/0267699 A1 | 12/2005 | Claseman |
| 2006/0268609 A1 | 11/2006 | Kim |
| 2007/0070710 A1 | 3/2007 | Takenaka |
| 2007/0147113 A1 | 6/2007 | Mokhlesi et al. |
| 2007/0171744 A1 | 7/2007 | Mokhlesi et al. |
| 2007/0252201 A1* | 11/2007 | Kito et al. | 257/331 |
| 2008/0209150 A1* | 8/2008 | Byeon | 711/166 |
| 2008/0247228 A1 | 10/2008 | Nguyen et al. |
| 2008/0247253 A1 | 10/2008 | Nguyen et al. |
| 2009/0097332 A1 | 4/2009 | Kim et al. |
| 2010/0074014 A1 | 3/2010 | Dunga et al. |
| 2010/0174845 A1* | 7/2010 | Gorobets et al. | 711/103 |
| 2010/0322000 A1* | 12/2010 | Shim et al. | 365/185.03 |
| 2011/0128788 A1* | 6/2011 | Honda | G11C 16/0408 365/185.11 |
| 2012/0081964 A1 | 4/2012 | Li |
| 2012/0220088 A1 | 8/2012 | Alsmeier |
| 2012/0275235 A1 | 11/2012 | Parker |
| 2013/0107628 A1 | 5/2013 | Dong et al. |
| 2014/0003157 A1 | 1/2014 | Mui et al. |
| 2014/0047163 A1 | 2/2014 | Kwak |
| 2014/0169095 A1 | 6/2014 | Avila et al. |
| 2014/0254267 A1* | 9/2014 | Sakui | G11C 16/10 365/185.11 |
| 2014/0269070 A1* | 9/2014 | Hsiung | G11C 16/26 365/185.11 |
| 2015/0003161 A1 | 1/2015 | Avila et al. |
| 2015/0221385 A1 | 8/2015 | Ahn et al. |
| 2015/0262714 A1 | 9/2015 | Tuers et al. |

OTHER PUBLICATIONS

U.S. Appl. No. 13/927,659, filed Jun. 26, 2013, 41 pages.
Final Office Action dated Nov. 9, 2015 for U.S. Appl. No. 13/828,361.
International Search Report/Written Opinion dated Jul. 4, 2014, for application PCT/US2014/019738.
Non-Final Office Action dated Jun. 19, 2015 for U.S. Appl. No. 13/828,361.
Non-Final Office Action dated May 12, 2016 for U.S. Appl. No. 13/828,361.

* cited by examiner

Programming into four states represented by a 2-bit code

SEGMENTATION OF BLOCKS FOR FASTER BIT LINE SETTLING/RECOVERY IN NON-VOLATILE MEMORY DEVICES

BACKGROUND

This application relates to the operation of re-programmable non-volatile memory systems such as semiconductor flash memory that record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

A first set of aspects relate to a non-volatile memory circuit having an array of non-volatile memory cells formed as a plurality of multi-cell erase blocks that are connectable to multiple bit lines spanning the plurality of erase blocks. Sensing circuitry is connected to the array, including a plurality of sense amp circuits connectable to the bit lines and logic circuitry whereby a timing for a sensing operation of selected memory cells is varied based upon the proximity along the bit lines to the sense amp circuits of the block to which the selected memory cells belong.

Other aspect present a method of operating a non-volatile memory circuit, the memory circuit including an array of non-volatile memory cells formed as a plurality of multi-cell erase blocks with a plurality of bit lines to which the memory cells of the blocks are connectable spanning the plurality of erase blocks and having a plurality of sense amp circuits connectable to the bit lines. The method includes receiving at the memory circuit a command involving a sensing operation for one or more selected memory cells; determining the memory block to which the selected memory cells belong; and setting a timing for the sensing operation based upon the proximity along the bit lines to the sense amp circuits of the block to which the selected memory cells belong.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
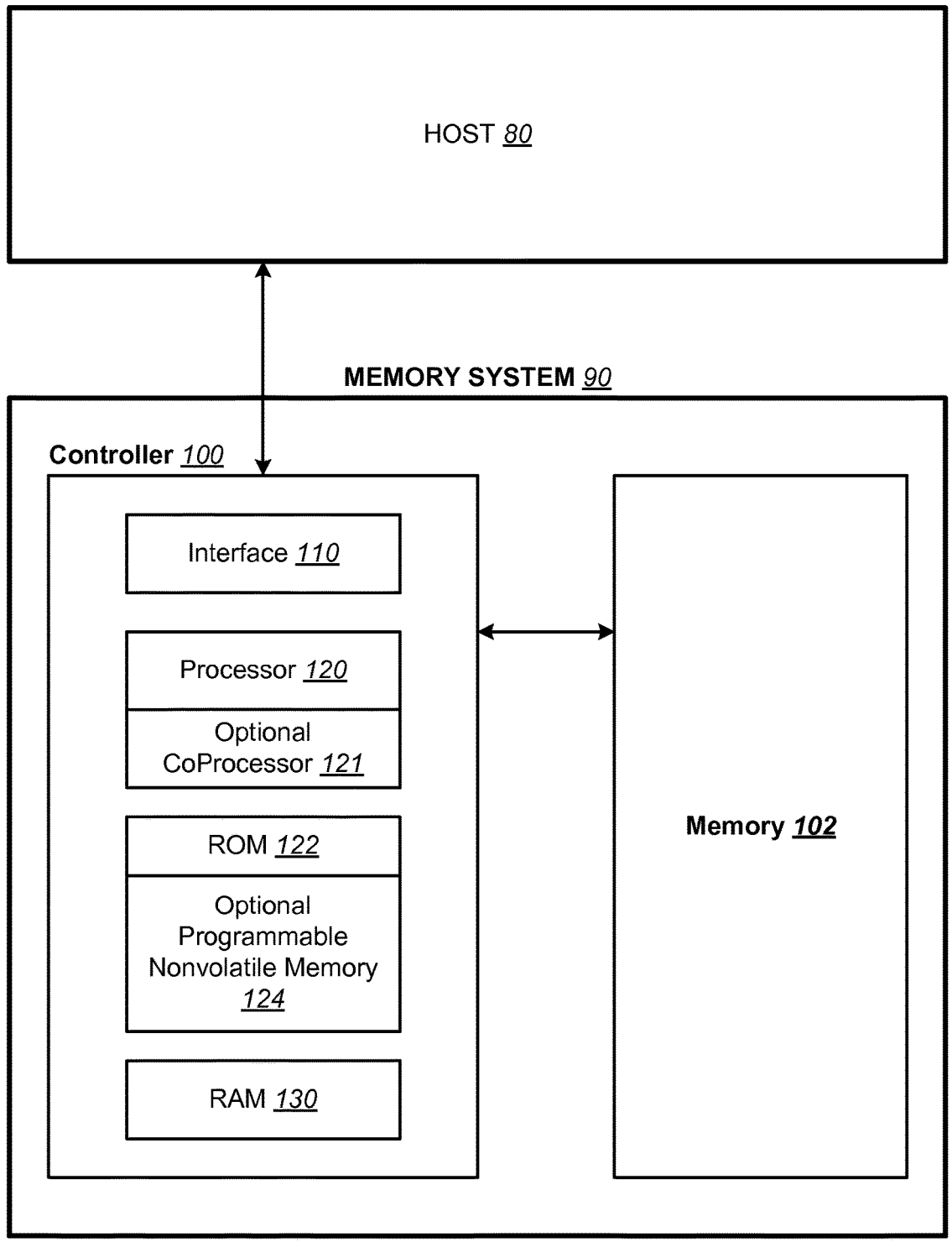
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

Physical Memory Structure

Figure 2:
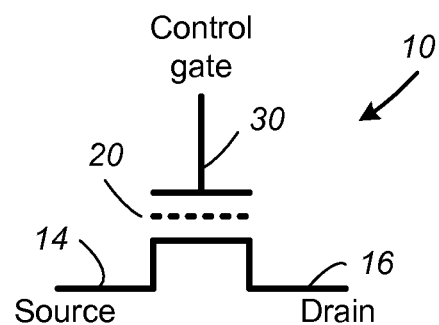
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
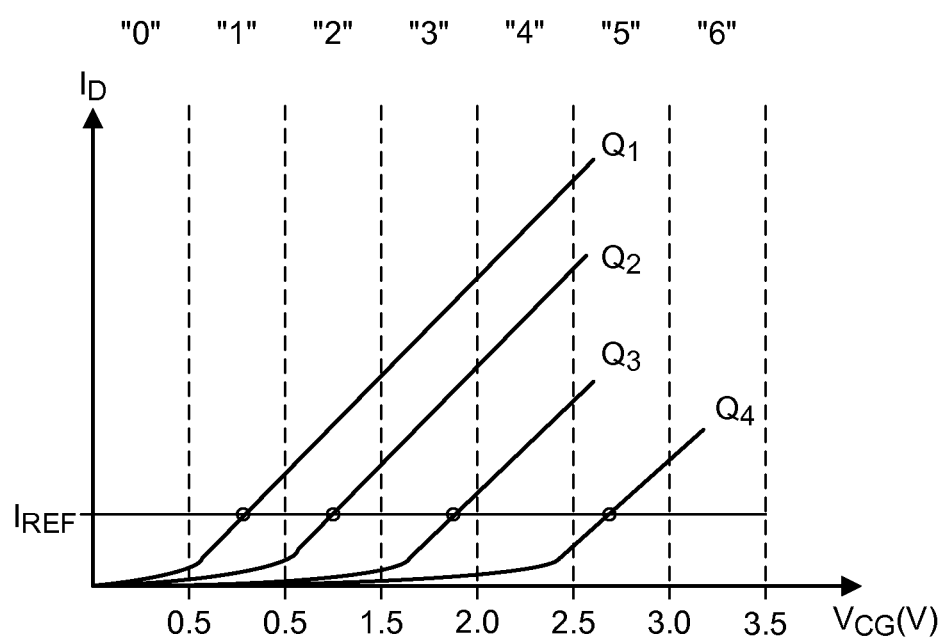
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
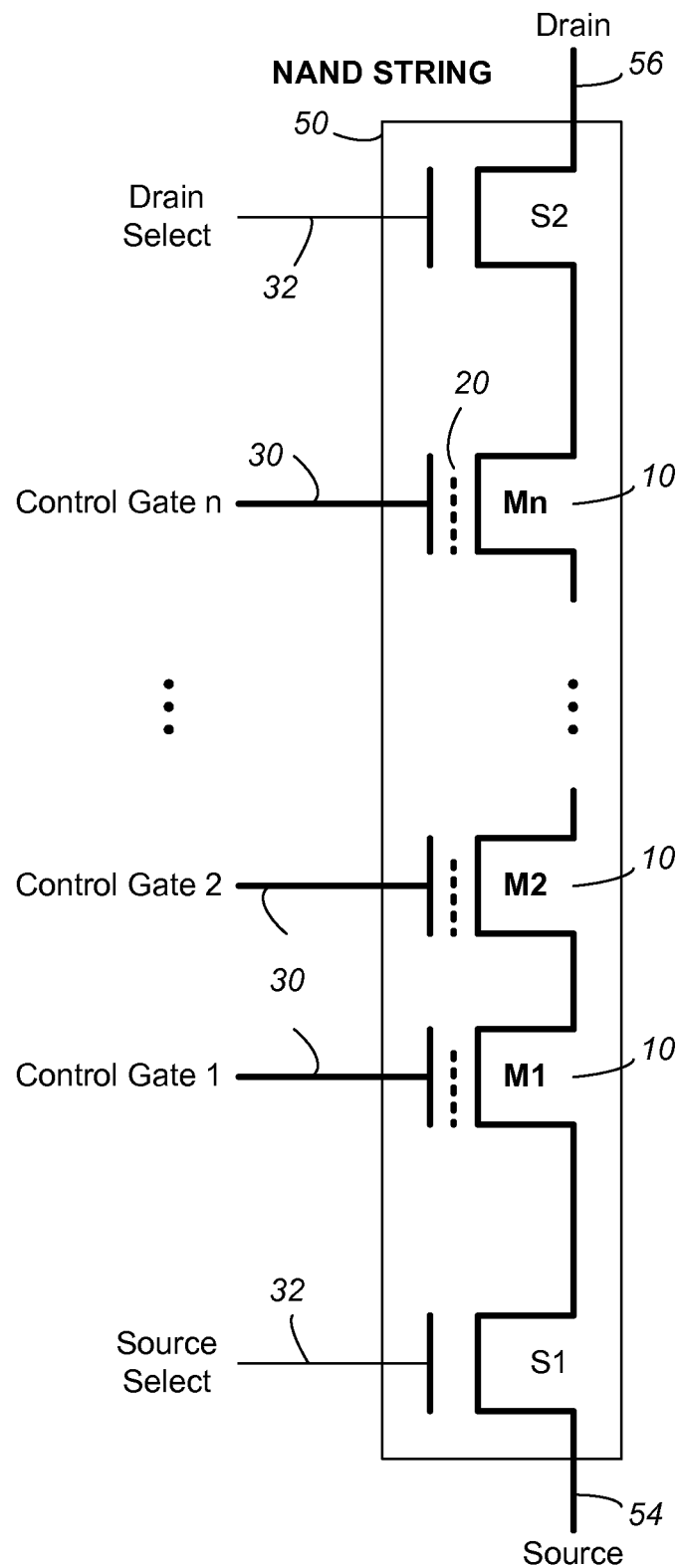
FIG. 4 illustrates schematically a string of memory cells organized into a NAND string.

FIG. 4 illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5:
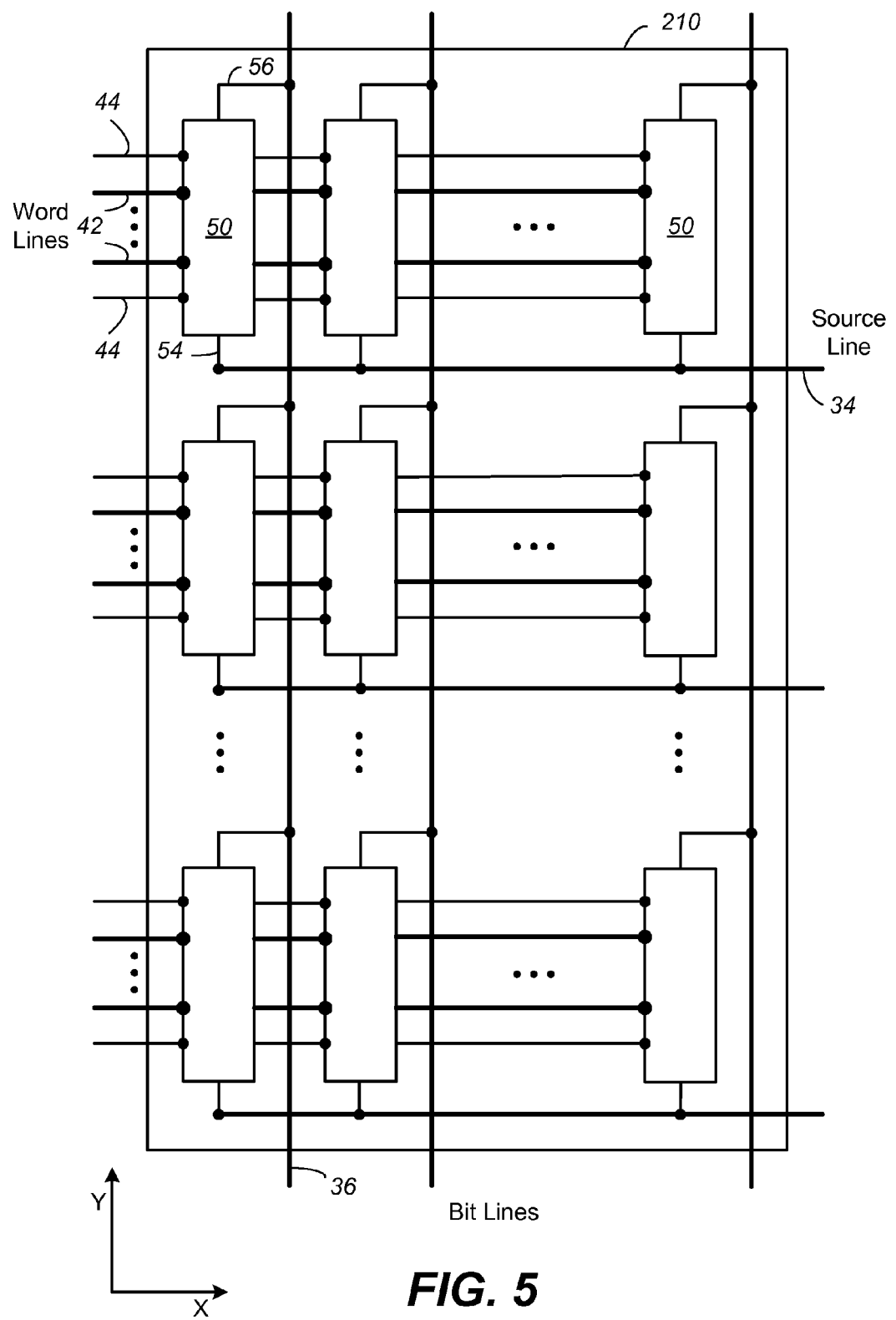
FIG. 5 illustrates an example of a NAND array 210 of memory cells, constituted from NAND strings 50 such as that shown in FIG. 4.

FIG. 5 illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 6:
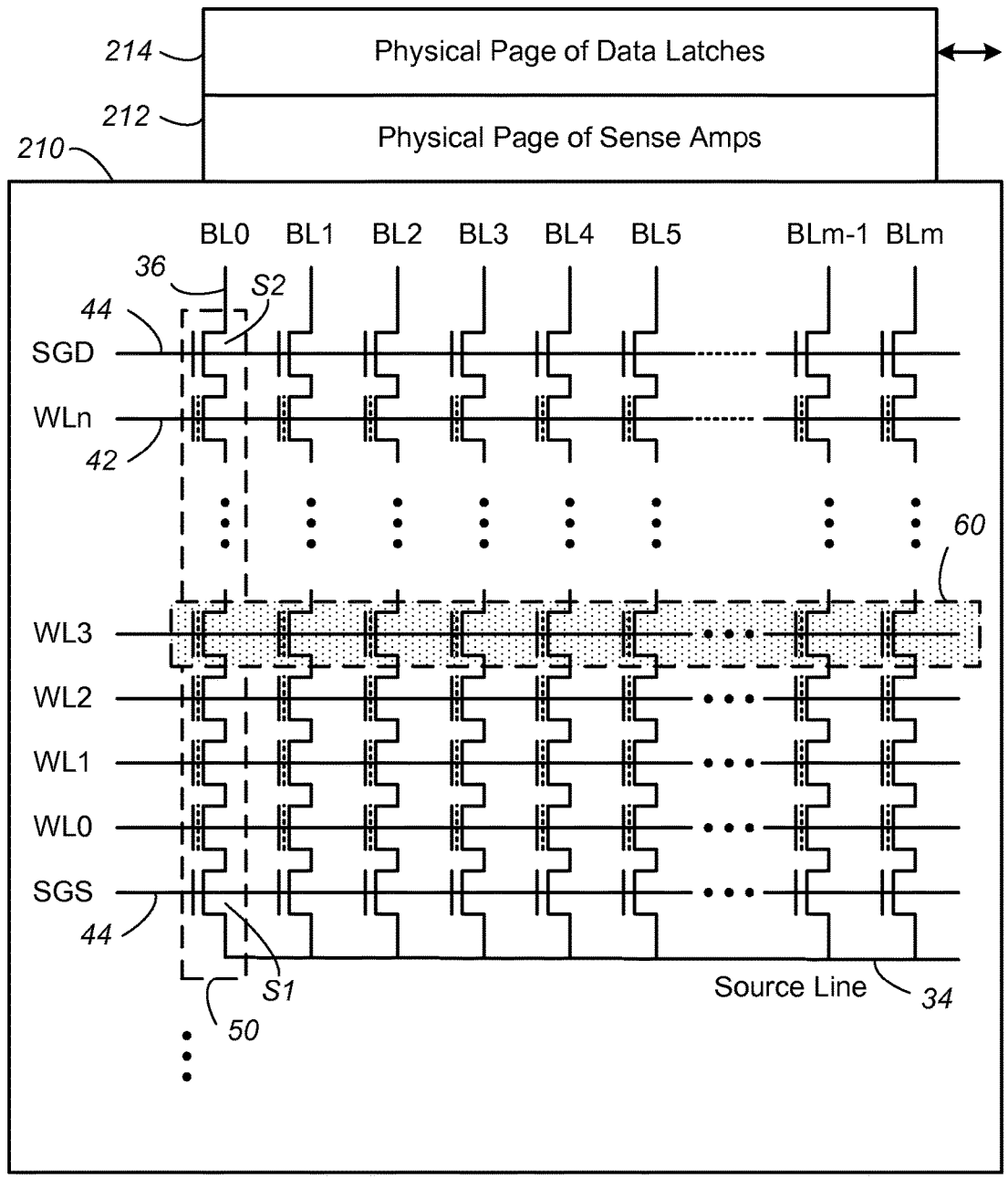
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7:
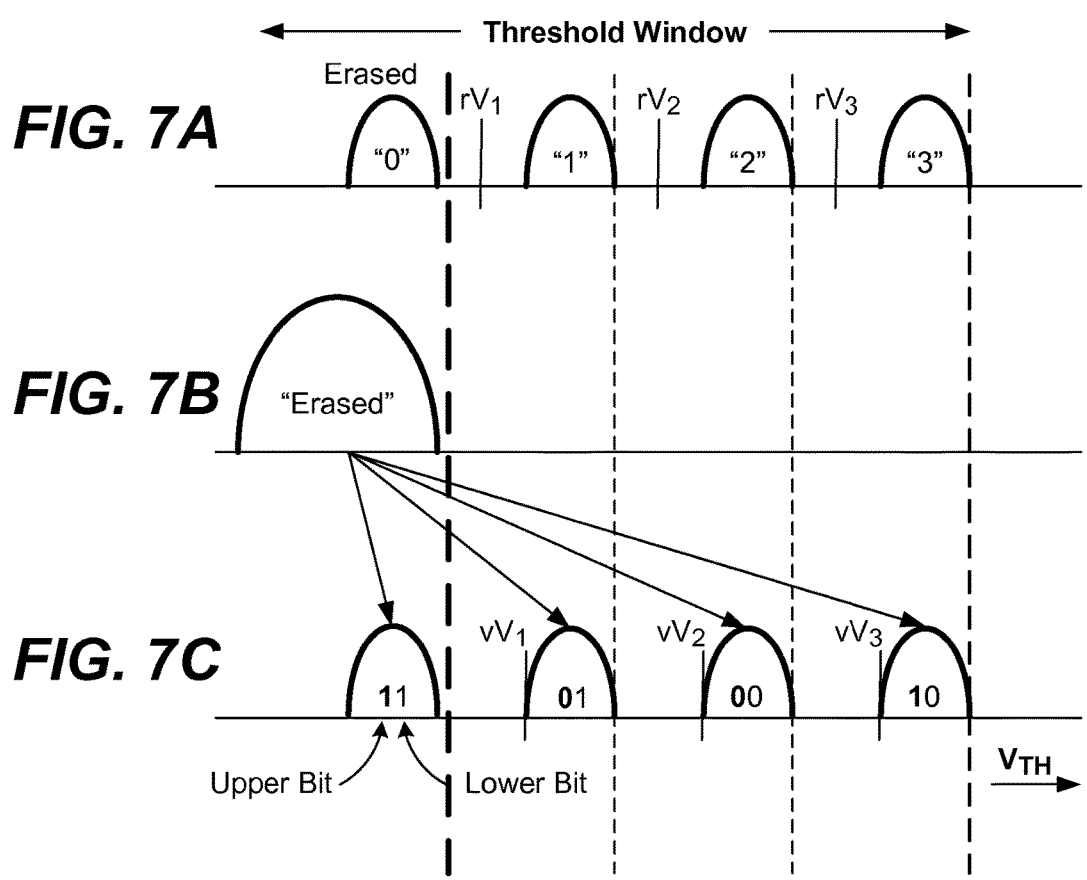
FIGS. 7A-7C illustrate an example of programming a population of memory cells.

FIG. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 7C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 8:
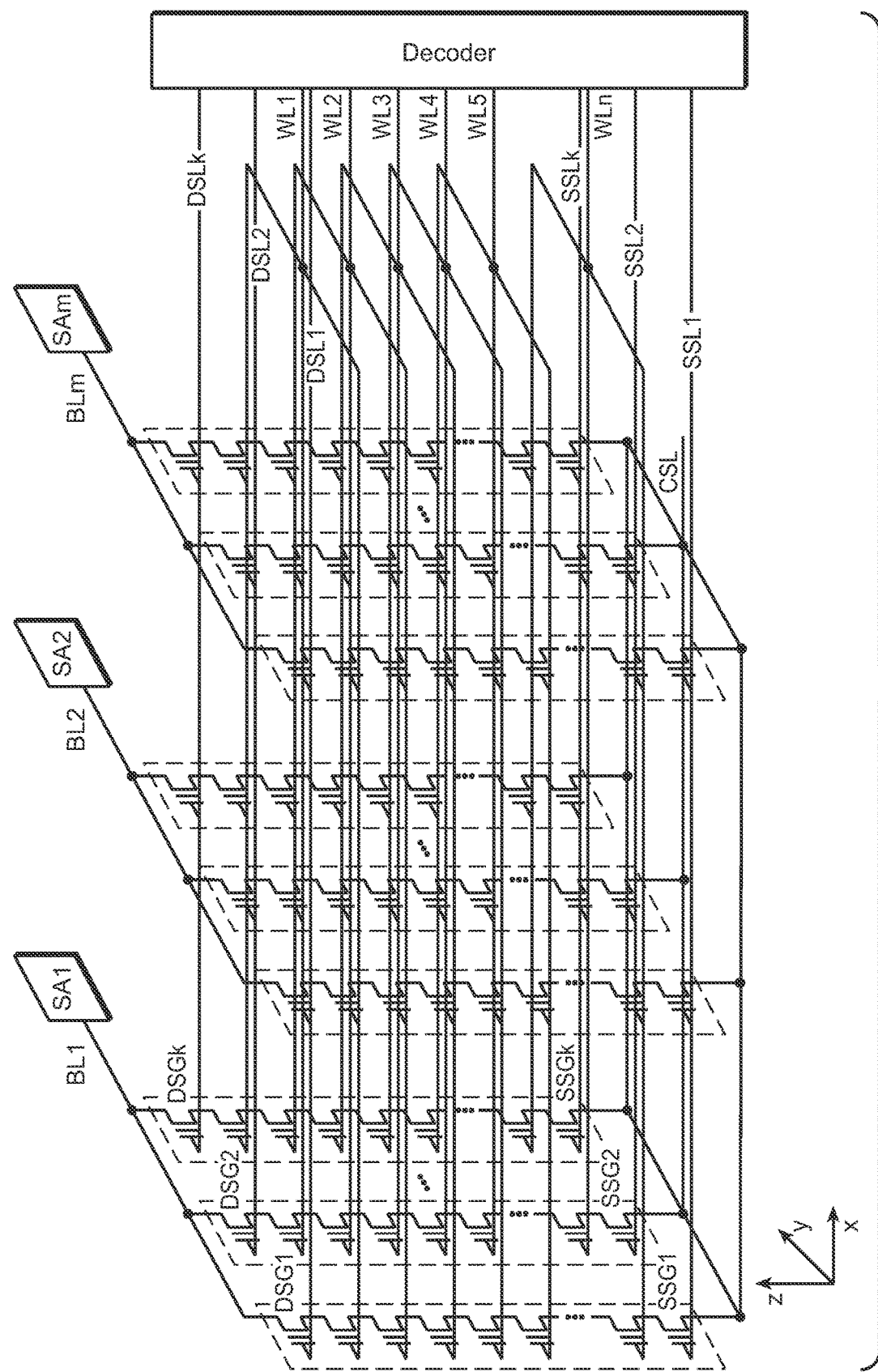
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-$m$, each run across the top to an associated sense amp SA1-$m$. The word lines, WL1-$n$, and source and select lines SSL1-$n$ and DSL1-$n$, then run in x direction, with the NAND string connected at bottom to a common source line CSL.

Figure 9:
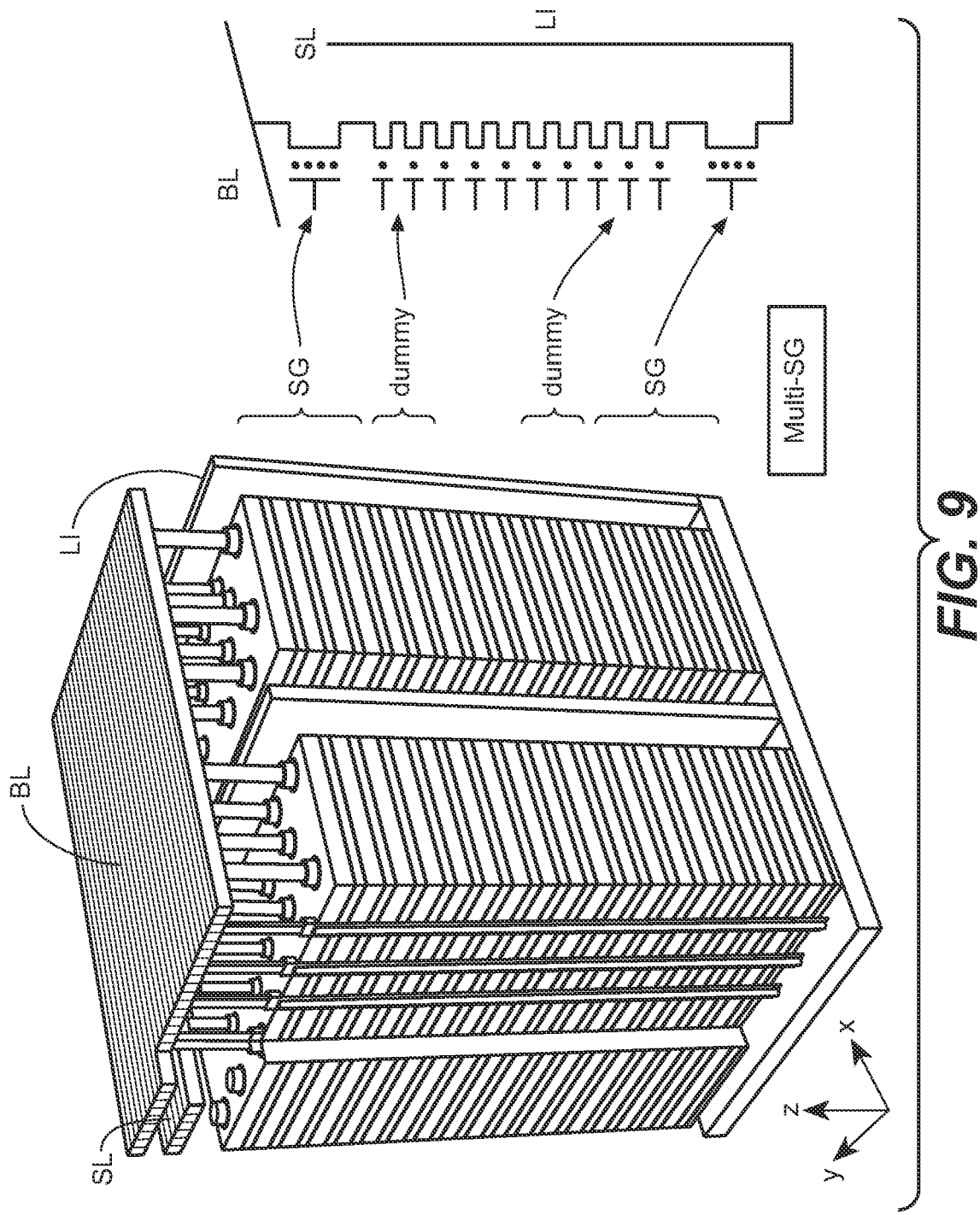
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up, such as is described in U.S. patent application Ser. No. 13/927, 659, filed on Jun. 26, 2013.

To the right of FIG. 9 is a representation of the elements of one of the vertical NAND strings from the structure to the left. Multiple memory cells are connected through a drain select gate SOD to the associated bit line BL at the top and connected through the associated source select gate SDS to the associated local source line LI to a global source line SL. It is often useful to have a select gate with a greater length than that of memory cells, where this can alternately be achieved by having several select gates in series (as described in U.S. patent application Ser. No. 13/925,662, filed on Jun. 24, 2013), making for more uniform processing of layers. Additionally, the select gates are programmable to have their threshold levels adjusted, aspects of which are described in US patent publication number 2014-0169095. This exemplary embodiment also includes several dummy cells at the ends that are not used to store user data, as their proximity to the select gates makes them more prone to disturbs.

Figure 10:
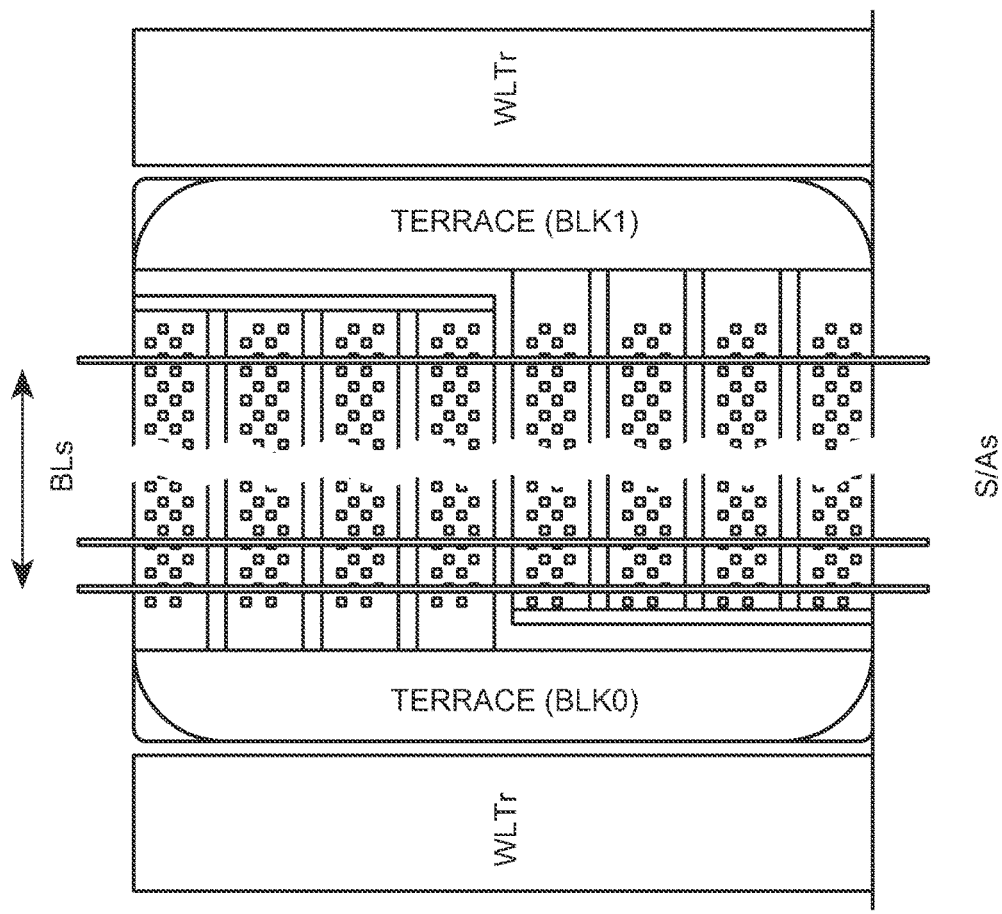

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
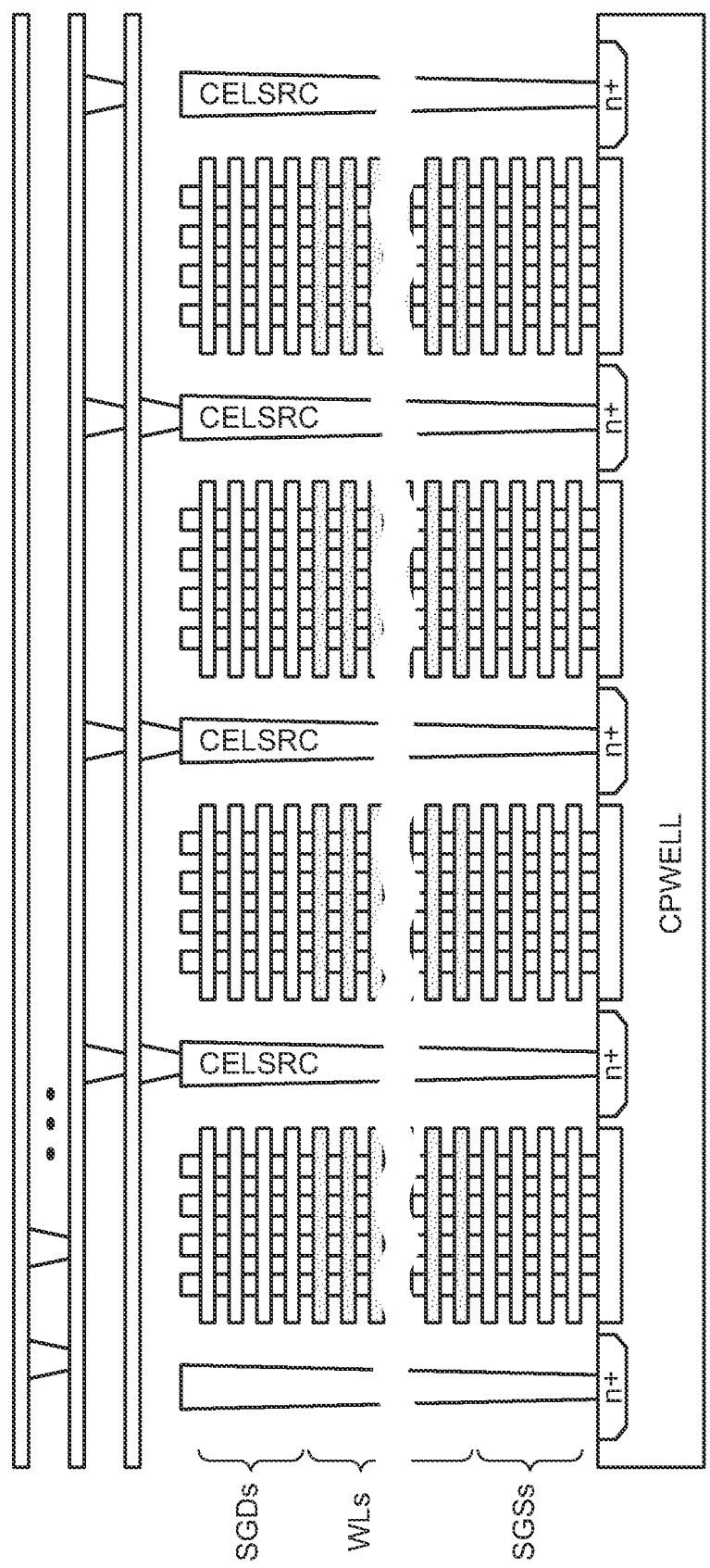

FIG. 11 shows a side view of one block, again with four fingers. In this exemplary embodiment, the select gates SOD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
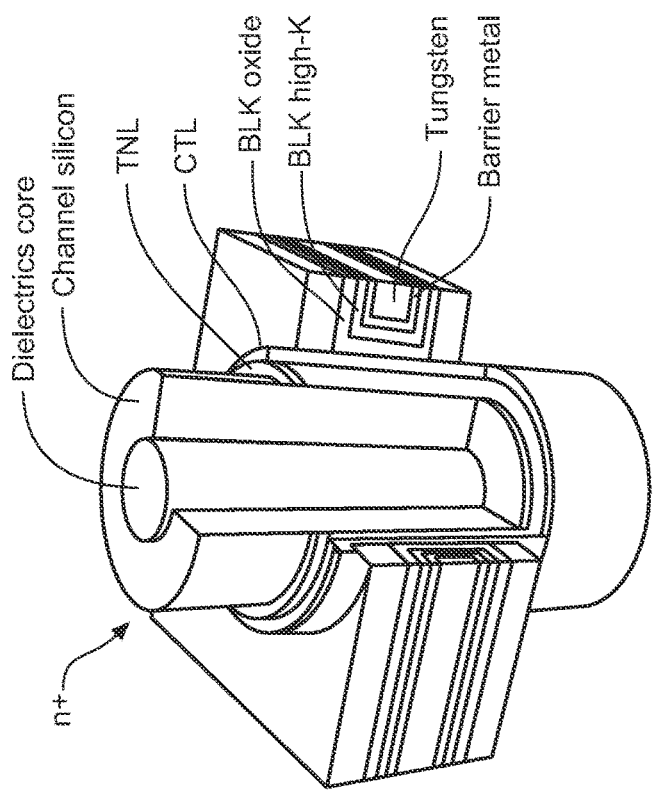

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Block Segmentation for Faster BL Settling/Recovery

In memory arrays, such as those described above, memory cells are typically formed along word lines and bit lines. FIGS. 5 and 10 show some examples of array structures where the NAND strings of memory cells are connected along global bit lines running across the array. These bit lines span multiple blocks or, typically, an entire plane. Sensing and other operations often require that bit lines be set to a particular voltage level. Blocks nearer to the sense amplifier circuits see a faster bit line settling/recover time compared to blocks further from the sense amps. This is because the far side blocks sees a huge bit line resistance and have an IR drop across it. Thus, the far side bit line level will be less compared to near side. As the far side bit line level is less compared to near blocks, it strongly couples its neighbor bit lines, taking more time to settle/recover. Consequently, far side blocks have and thus we see slower performance and also burn more current as current is flowing for a longer time until the BL settles/recovers. To avoid error, the memory device would set timings based on the slowest blocks, requiring more time and current than needed for the faster, nearer blocks.

Figure 13:
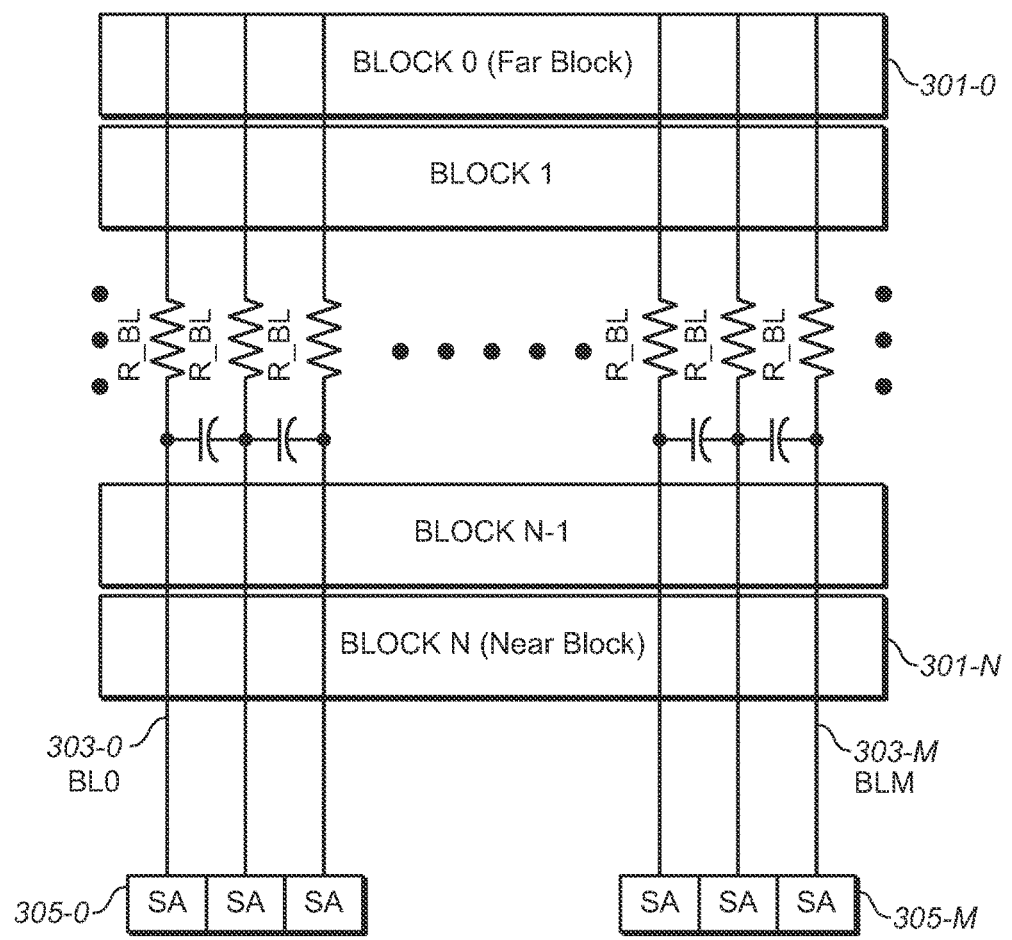
FIG. 13 shows an array of blocks spanned by set of bit lines each connected to a corresponding sense amp.
Figure 14:
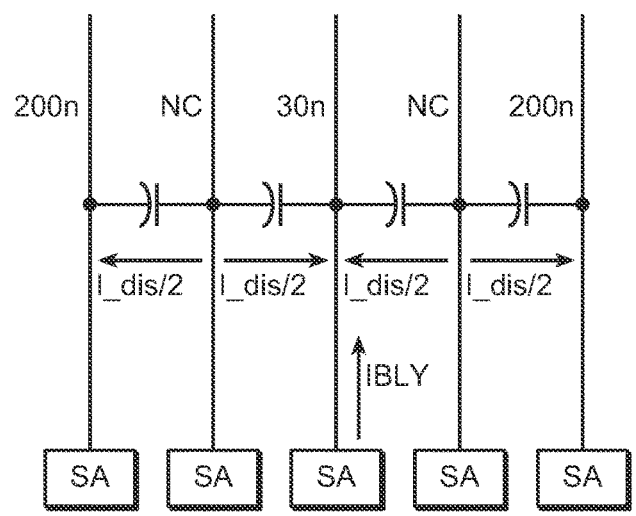
FIG. 14 looks at a problematical bit line pattern with respect to settling times.

The situation can be illustrated by FIG. 13 that shows an array of N+1 blocks, where N can run into the hundreds or thousands. A set of bit lines BL0 to BLM, 303-0 to 303-M spans the blocks and are each connected to a corresponding sense amp SA 305-0 to 305-M. FIG. 13 shows one bit line per sense amp, but in other arrangements where less than all of the bit lines are selected concurrently (as where only every other or every fourth bit line is sensed together). The resistance along the bit lines between the near (to the sense amps) and far blocks is represented schematically as R_BL and the inter-bit line capacitance is also shown. This resistance along the bit lines and the inter-bit line capacitance can result to significant differences in settling times between the nearest block 301-N and the farthest block 301-0. FIG. 14 considers this situation further.

A sensing operation can be of the lock out type or no lock out type. When reading multi-state data, such as illustrated above with respect to FIG. 7A-7C, the memory typically starts with the lowest state and works its way up through the higher states. Once a cell is read and determined to be in, say, the 1 state, it does not need to checked for the 2 and higher states; and if the cell is read for these higher states, they will be conducting, wasting current while providing no additional information. To avoid this, the memory device can use a "lock out read" where, once a cell's state is determined, that bit line is locked out from further reading for other, higher states until that page is finished and the memory moves on to a new page. Consequently, a lock out read uses less current, but at the cost greater complexity and lower performance so that "no lock out" (NLO) operations are also commonly used, depending on the application. (More information on no lock out reads and also sense amplifier circuitry applicable here can be found in US patent publication number 2014-0003157.) The consequences of the near block-far block variation is more pronounced in the no lock out case, as can be illustrated with respect to FIG. 14.

FIG. 14 looks at the most problematical bit line pattern for the no lock out case. With respect to the center g bit line, the second-most adjacent bit lines are highly conductive (as if the corresponding selected memory cells were in, for example, the 0 state and the sensing operation is for the 3 state, pulling, say, 200 nA) can couple down the immediate neighbor non-conducting bit lines, making their ramp up slower and resulting in a longer bit line settling time. The amount of coupling is dependent on the final level of the highly conducting bit lines. Due to bit line resistance, when a far side block is selected the bit line will see a significant IR drop and the highly conductive bit line level at the far side block will be much lower, thus coupling even more strongly, leading to longer bit line settling time.

Figure 15:
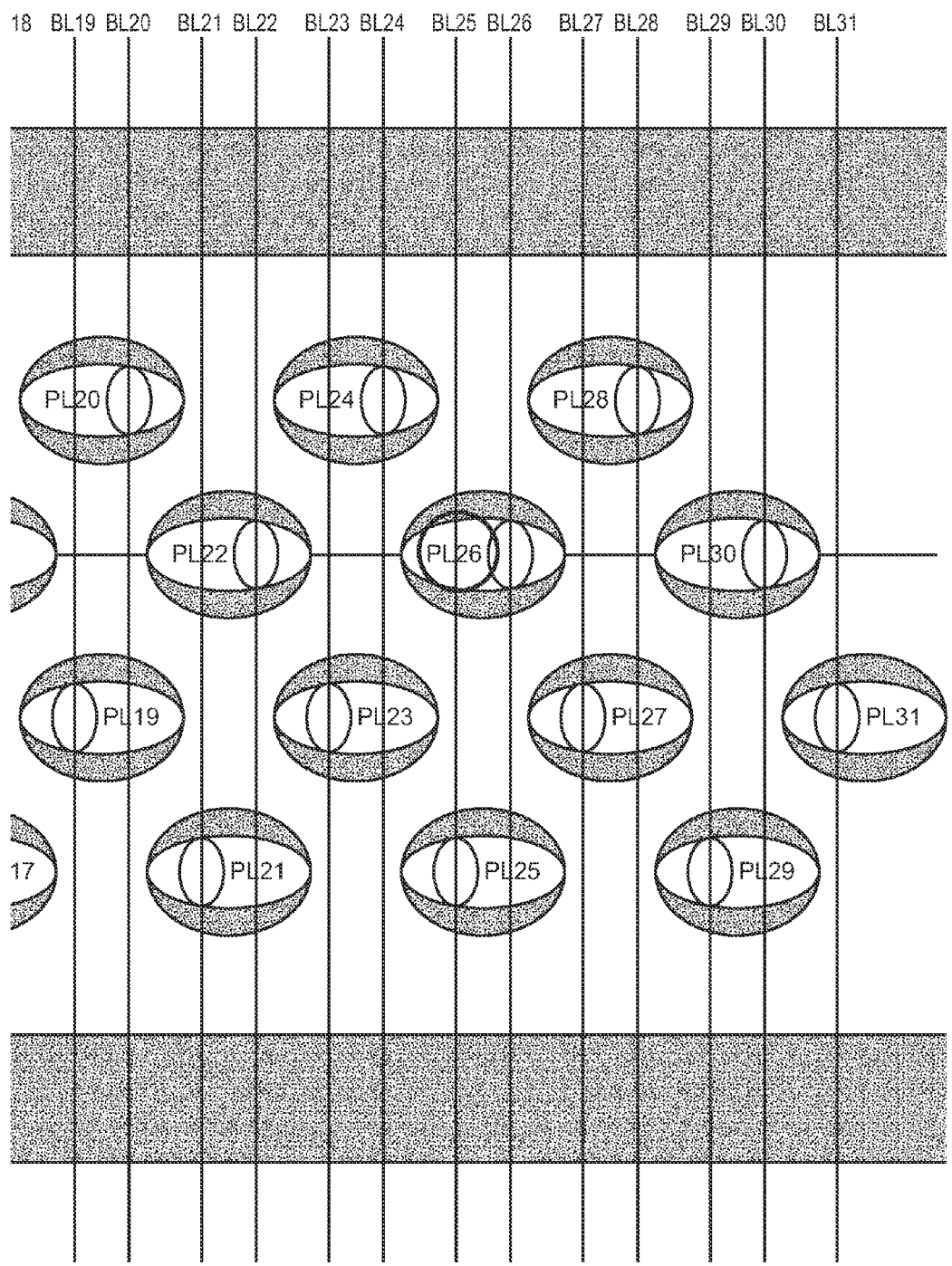
FIG. 15 is a more detailed view of a portion of a finger structure seen from above.

The following discussion is mainly given the context of a 3D NAND structure of the BiCS type since the situation is often more acute for this architecture, but the techniques described are applicable to other types of array architectures, including the 2D NAND. The reason why the problem is more acute for the BiCS types structure can be seen by comparing FIG. 6 with FIG. 15. In the 2D NAND block of FIG. 6, each bit line (aside from the end bit lines) has one neighbor on each side. FIG. 15 is a more detailed view of a portion of a finger structure seen from above, where the NAND strings run down into the page. Looking at NAND string PL26, this has a number of near neighbors with which it may couple and the off-setting of these columns places the global bit lines across the top in close proximity, aggravating the problem relative to the 2D structure. Whether for 2D or 3D, the continued in decreasing device scales and increasing of place size will continue to make this problem prominent.

Figure 16:
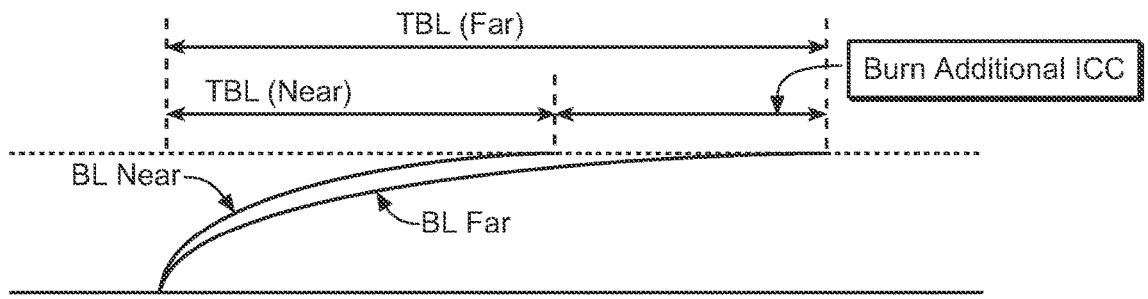
FIG. 16 illustrates the relative times for pre-charging a bit line for a near block, TBL(near), and a bit line for a far block, TBL(far).
Figure 17:
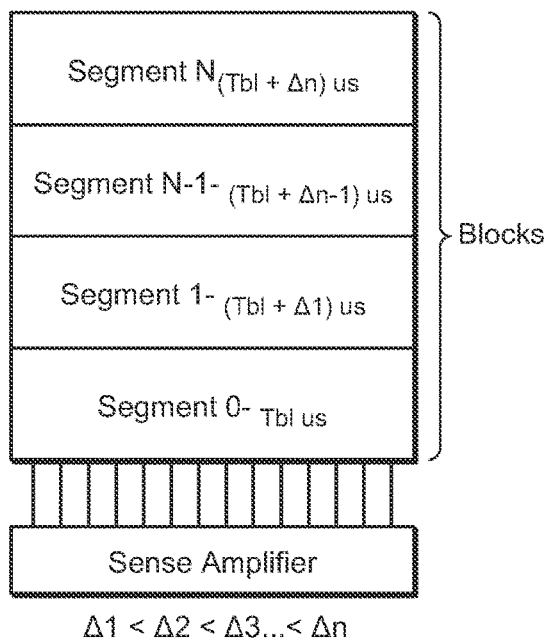
FIG. 17 illustrates the blocks of an array split up into a number of segments, each of one or more adjacent blocks.

FIG. 16 illustrates the effect, showing the relative times for pre-charging a bit line for a near block, TBL(near), and a bit line for a far block, TBL(far). The near block bit line has a shorting settling time, ramping up mover quickly than for the far side, consequently having faster performance. If the same timing is used for both the near and far blocks, the additional time allotted for the far blocks will burn current not needed to the settling process. To be able to improve performance and power consumption for the block nearer the sense amp circuits, these can use different timing. In the exemplary embodiment, the total number of blocks is divided into N number of segments, where the closer a segments is to the sense amps can, short the time allotted, improving performance and using less current. FIG. 17 represents this schematically.

As shown in FIG. 17, the blocks spanned by the bit lines are split up into a number of segments, each of one or more adjacent blocks. In the example, Segment 0 is nearest the sense amplifier circuits and each of the N additional segments, where N≥1, use a different timing depending on proximity to the sense amps. Being closest to the sense amps, the blocks in Segment 0 will have the best performance, use the least system current ICC, and can use the fasting timing, Tbl. Each of the other segments will have different timing offset $\Delta i$ for Segment i, the offsets being longer as the block segment is further away: $\Delta 1 < \Delta 2 < \Delta 3 \ldots < \Delta N$. (Equivalently, the base timing could be for the furthest or an intermediate Segment, the offsets being decreases or increases as appropriate.) The setting of the time can be based on a control signal (here represented as "cont") to the sense amp circuitry from the on-chip control logic, for example, based on the physical address to be accessed. For example, a sensing operation will typically have a number of sub-operations or phases to establish the needed bias conditions, such as setting levels on a bit line clamp, turning on select gates, and so on. The total read or verify time while the combined clocks from these phases. Although the other phases' clocks signals can be the same, the control signal here will set the time allotted for bit lines to settle after a bit line select gate is turned on to pre-charge the bit line form the sense amp.

In FIG. 17 the segments are represented as being of the same size, but the number of blocks can also vary from segment to segment if the timing variations along the bit lines is particularly non-linear, with, for example, segments having fewer blocks where timing variations change more quickly. Similarly, the difference in the $\Delta i$ may be a uniform step size (i.e., number of clock cycles) or not, depending upon device behavior.

The difference in segment timings can be based on using a different number of clock cycles. The values can be settable parameters determined by the behavior of the device or similar devices during device characterization tests. Depending on the embodiment, the initial values set prior the devices being supplied to users can be fixed or changed as the device ages. A wide range of values for the parameter can be available, from which values can be selected, where these values may change as a device ages, depending on the change of sheet resistance of the metal and also bit line lengths. The settling times involved can be for sensing (both data read and verify) operations, including pre-charge and other phases where a bit line level needs to be set, or other operations using the sense amps to set bit line levels.

Figure 18:
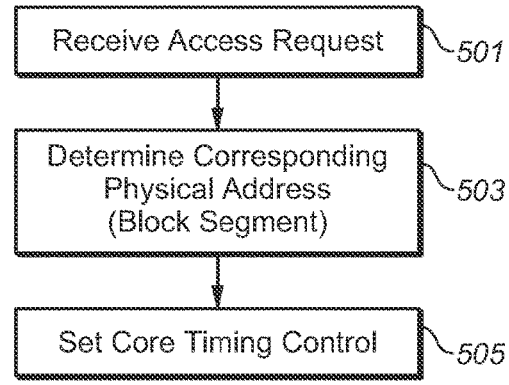
FIG. 18 is a simplified flow of some aspects of the process involved.

FIG. 18 is a simplified flow of some aspects of the process involved. The memory circuit receives an access request for a specified physical address at 501. At 503 the memory circuit then determines the block segment, or more generally just the block, to which the specified address corresponds. At 505, the core timing is then set for the corresponding operation based on the determined block segment to reflect the proximity to the sense amps. In this way, the memory system can provide high performance while reducing current consumption.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A non-volatile memory circuit, comprising:
an array of non-volatile memory cells formed as a plurality of blocks;
a plurality of bit lines spanning the plurality of blocks to which the memory cells of the blocks are connected; and
sensing circuitry connected to the array, including a plurality of sense amp circuits connected to the bit lines, wherein the sensing circuitry varies a time allotted for biasing the array for a sensing operation of selected memory cells based upon a physical distance along the bit lines from the sense amp circuits to the block of the selected memory cells,
wherein:
each of the blocks belongs to one of a plurality of block groups,
each of the block groups contains one or more adjacent blocks of the array,
the blocks of a group use a shared time allotment for biasing the array for the sensing operations of selected memory cells belonging thereto,
the different block groups use different time allotments for biasing the array for the sensing operations of selected memory cells belonging thereto, and
block groups that are physically closer to corresponding ones of the sense amp circuits along the bit lines than others of the block groups are biased for shorter time allotments than the others of the block groups to reduce total power expended during the biasing.

2. The non-volatile memory circuit of claim 1, wherein the shared timings of the different block groups differ from each other by an offset.

3. The non-volatile memory circuit of claim 2, wherein initial values for the offsets are based upon device characterization tests.

4. The non-volatile memory circuit of claim 2, wherein initial values for the offsets are set prior to the memory circuit being supplied to a user.

5. The non-volatile memory circuit of claim 4, wherein one or more of the offsets are changed after the non-volatile memory circuit has aged.

6. The non-volatile memory circuit of claim 1, wherein the different time allotments vary in a number of clock cycles allotted for a phase of the sensing operation.

7. The non-volatile memory circuit of claim 6, wherein the phase of the sensing operation is a pre-charge operation.

8. The non-volatile memory circuit of claim 1, wherein the sensing operation is a data read.

9. The non-volatile memory circuit of claim 1, wherein the sensing operation is a program verify.

10. The non-volatile memory circuit of claim 1, wherein the non-volatile memory circuit is a monolithic three-dimensional semiconductor memory device where the memory cells are arranged in multiple physical levels above a silicon substrate and comprise a charge storage medium.

11. A method, comprising:
receiving at a non-volatile memory circuit a command that includes a sensing operation for one or more selected memory cells, the memory circuit including an array of non-volatile memory cells formed as a plurality of multi cell erase blocks with a plurality of bit lines to which the memory cells of the blocks are connected spanning the plurality of erase blocks and having a plurality of sense amp circuits connected to the bit lines;
determining the erase block to which the selected memory cells belong; and
allotting time for biasing the array for the sensing operation based upon a physical distance along the bit lines from the determined block to the sense amp circuits,
wherein:
the memory circuit configures each of the blocks belonging to one of a plurality of block groups,
each of the block groups contains one or more adjacent blocks of the array,
the blocks of a group use a shared time allotment for the sensing operation of selected memory cells belonging thereto,
the different groups use different time allotments for the sensing operation of selected memory cells belonging thereto,
determining the erase block to which the selected memory cells belong comprises determining the block group to which the determined block belongs,
allotting time includes selecting the time allotment for the block group to which the determined block belongs, and
allotting time further includes allotting less time for biasing block groups that are physically closer to the corresponding sense amp circuits along the bit lines than for biasing block groups that are physically further from the corresponding sense amp circuits to conserve power.

12. The method of claim 11, wherein the time allottments of different block groups differ from each other by an offset.

13. The method of claim 12, wherein the offsets are settable parameters.

14. The method of claim 12, wherein the offsets differ by a number of clock cycles.

15. The method of claim 11, wherein the non-volatile memory circuit is a monolithic three-dimensional semiconductor memory device where the memory cells are arranged in multiple physical levels above a silicon substrate and comprise a charge storage medium.

16. A non-volatile memory circuit, comprising:
an array of non-volatile memory cells formed as a plurality of multi cell erase blocks;
a bit line spanning the plurality of erase blocks to which the memory cells of the blocks are connected;
logic circuitry configured to allot time for biasing the array for sensing operations; and
sensing circuitry connected to the array, including a plurality of sense amp circuits connected to the bit line and the logic circuitry, wherein the sensing circuitry is configured to allot time for biasing the array for the sensing operations of selected memory cells proportionally to a physical distance along the bit line from the sense amp circuits to the block that includes the selected memory cells to expend less power biasing selected memory cells that are physically closer to the sense amp circuits than for biasing selected memory cells that are physically further from the sense amp circuits,
wherein:
   each of the blocks belongs to one of a plurality of block groups,
   each of the block groups contains one or more adjacent blocks of the array,
   the blocks of a group use a shared timing for the sensing operation of selected memory cells belonging thereto,
   different block groups use different timings for the sensing operation of selected memory cells belonging thereto.

17. The non-volatile memory circuit of claim 16, wherein the time allotments of the different block groups differ from each other by an offset.

18. The non-volatile memory circuit of claim 16, wherein the sensing circuitry is configured to vary time allotments for biasing the array during the sensing operations based on coupling between the bit line and conductors within the array.

* * * * *